United States Patent [19]

Ohtani

[11] Patent Number: 4,760,562
[45] Date of Patent: Jul. 26, 1988

[54] MOS STATIC MEMORY CIRCUIT

[75] Inventor: Takayuki Ohtani, Tokyo, Japan

[73] Assignee: Kabushiki Kaisha Toshiba, Kawasaki, Japan

[21] Appl. No.: 800,270

[22] Filed: Nov. 21, 1985

[30] Foreign Application Priority Data

Dec. 4, 1984 [JP] Japan .................. 59-256149
Oct. 28, 1985 [JP] Japan .................. 60-240971

[51] Int. Cl.⁴ .................. G11C 13/00; G11C 7/00
[52] U.S. Cl. .................. 365/227; 365/190
[58] Field of Search .............. 365/233, 189, 207, 208, 365/190, 227

[56] References Cited

U.S. PATENT DOCUMENTS

| | | | |
|---|---|---|---|
| 4,120,047 | 10/1978 | Varadi | 365/190 |
| 4,409,679 | 10/1983 | Kurafuji et al. | 365/227 X |
| 4,455,628 | 6/1984 | Ozaki et al. | 365/226 |
| 4,542,486 | 9/1985 | Anami et al. | 365/189 |

FOREIGN PATENT DOCUMENTS 59-90290  3/1984  Japan .................. 365/227

OTHER PUBLICATIONS

Minato et al., "A Hi-CMOSII 8K×8b Static RAM," IEEE International Solid-State Circuits Conference, Feb. 12, 1982.

Primary Examiner—Stuart N. Hecker
Assistant Examiner—Alfonso Garcia
Attorney, Agent, or Firm—Finnegan, Henderson, Farabow, Garrett and Dunner

[57] ABSTRACT

Voltage converters are arranged in units of columns in a memory device. Each voltage converter is connected to a column decoder. The column decoder receives a column address signal and supplies a column selection signal to the voltage converter. The voltage converters apply a ground level voltage to the source junctions of the drive transistor pairs of the memory cells of the selected columns, and a voltage higher than the ground level voltage to the source junctions of the drive transistor pairs of the memory cells of the nonselected columns so as to decrease power consumption in the nonselected columns as compared with that in the selected columns.

10 Claims, 3 Drawing Sheets

FIG. 2    FIG. 3A  FIG. 3B
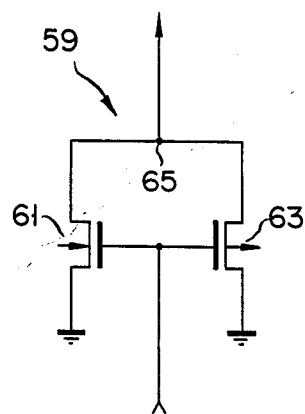
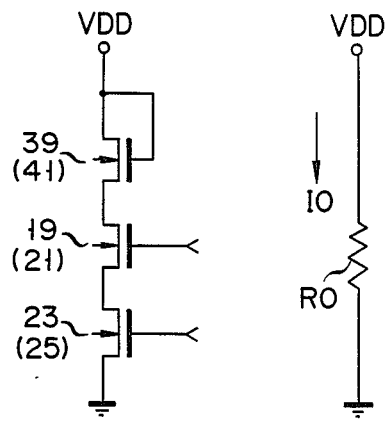
FIG. 4A  FIG. 4B
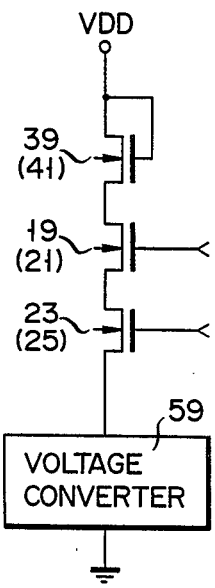
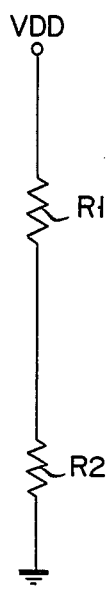
FIG. 6
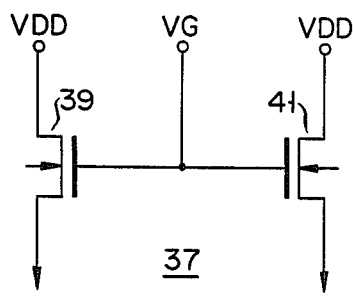

MOS STATIC MEMORY CIRCUIT

BACKGROUND OF THE INVENTION

The present invention relates to an improvement in a semiconductor memory device, and, more particularly, to a memory cell device of a MOS (Metal Oxide Semiconductor) static memory that consumes little power.

A conventional CMOS static RAM has an arrangement as shown in FIG. 4 of "A HI-CMOSII 8K×8Kb Static RAM", O. Minato et al., ISSCC 1982, Digest of Technical Paper, PP. 256–257. The RAM has memory cells arranged in a matrix form composed of rows and columns. Bit and word lines are connected to the memory cells. Each bit line is connected to a power source voltage through a bit line load circuit.

In a conventional static RAM of this type, each memory cell is connected to a ground terminal. In the columns which are not selected for read/write access (to be referred to as nonselected columns hereinafer), a current always flows from the power source to the ground through the bit line load circuit, the bit lines and memory cells being connected to the selected word lines. In other words, current always flows through the bit lines of the nonselected columns.

During write/read access, it is only necessary to use the memory cells of the selected columns to achieve the function of the memory device. Therefore, the power consumption of the memory cells of the nonselected columns may be minimized within the data retaining range of the memory cells without impairing the function of the memory device.

In the conventional static RAM, however, the power consumption of the memory cells of the nonselected columns is substantially the same as that of the selected columns. During an operation of write/read access, most of the columns are nonselected columns. More particularly, in a static RAM constituting one word by n bits, the total number of selected columns is n, and the remaining columns are nonselected columns. For example, in a 256-kbit RAM of 32 kwords 8 bits, eight columns from among 512 columns are selected columns, and 504 columns are nonselected columns. For this reason, most of the total operating power consumed is power consumption by the memory cells of the nonselected columns.

In the conventional static memory device, the operating power consumption of the nonselected columns is large, and power is wasted because it exceeds the level necessary to retain the data.

SUMMARY OF THE INVENTION

It is an object of the present invention to provide a static memory device that consumes little power relative to conventional memory devices.

In order to achieve the above object of the present invention, there is provided a memory device comprising:

static memory cells arranged in a matrix form, each memory cell being provided with a pair of drive transistors;

bit lines arranged in units of columns and commonly connected to the memory cells of a corresponding column; and a voltage control circuit, connected to the memory cells, for receiving a column selection signal for selecting at least one column of the memory cells and for controlling a voltage at one end of each of the current paths of the drive transistor pairs of the memory cells of the selected column and a voltage at one end of each of the current paths of the drive transistor pairs of the memory cells of the nonselected columns, in such a manner that the bit line current of each nonselected column is smaller than that of each selected column.

With this arrangement, the bit line current of each nonselected column in the memory device can be smaller than that of each selected column. The nonselected columns account for most of the total number of columns in the memory device. For this reason, a bit line current can be greatly decreased as a whole and power consumption of the memory device can be significantly reduced as compared with that of a conventional memory device. A memory device having low power consumption is thus provided.

BRIEF DESCRIPTION OF THE DRAWINGS

FIG. 2 is a circuit diagram showing a voltage converter in the device of FIG. 1;

FIGS. 3A, 3B, 4A and 4B are equivalent circuit diagrams of the circuits of the memory device of FIG. 1 when a current flow is considered;

FIG. 6 is a circuit diagram of a bit line load circuit explaining a third embodiment of the present invention.

DETAILED DESCRIPTION OF THE PREFERRED EMBODIMENTS

A memory device according to a first embodiment will be described with reference to FIGS. 1 to 4B.

Figure 1:
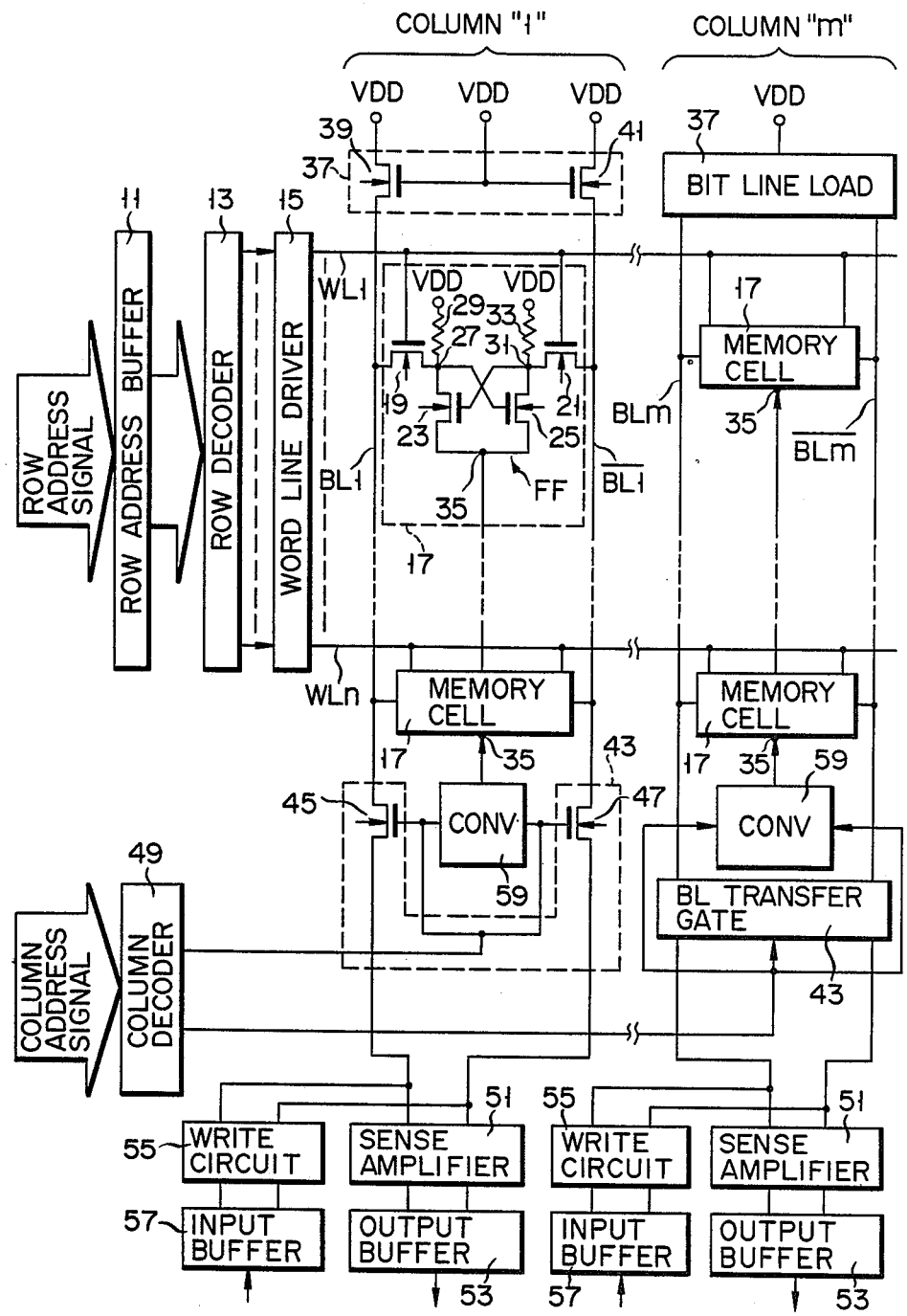
FIG. 1 is a block diagram of a memory device according to a first embodiment of the present invention.

The arrangement of the memory device of the first embodiment will be described with reference to FIG. 1. FIG. 1 mainly shows the first and mth columns, other columns being omitted since they have substantially the same arrangement as the first and mth columns.

A row address signal is supplied to a row address buffer 11. The row address signal from the buffer 11 is supplied to a row decoder 13. The decoder 13 decodes the input row address signal. An output signal from the decoder 13 is supplied to a word line driver 15. Output terminals of the driver 15 are connected to word lines WL (WL1 to WLn). The driver 15 sets a voltage level of one of the word lines WL which corresponds to the input signal at an active level (H level). Each word line WL is connected to memory cells 17 whose designation corresponds to the column number.

Each memory cell 17 is arranged as follows. First and second transfer gates 19 and 21 are connected to the word line WL. The gates 19 and 21 are turned on/off in accordance with the voltage level of the line WL. One end of a current path of the gate 19 is connected to one bit line BL. One end of a current path of the gate 21 is connected to the other bit line $\overline{BL}$. The other end of the current path of the gate 19 is connected to the drain of a first n-channel MOS transistor 23 and the gate of a second n-channel MOS transistor 25. The other end of the current path of the gate 21 is connected to the drain of the transistor 25 and the gate of the transistor 23. The sources of the transistors 23 and 25 are connected to each other. The transistors 23 and 25 constitute a drive transistor pair for the memory cell 17. A resistor 29 is connected between a terminal supplied with a power source voltage VDD (to be referred to as a power source voltage VDD terminal hereinafter) and a junction 27 between the drain of the transistor 23 and the gate of the transistor 25. A second resistor 33 is connected between the power source voltage VDD terminal and a junction 31 between the drain of the transistor 25 and the gate of the transistor 23. The transistors 23 and 25 and the resistors 29 and 33 constitute a storage data retaining flip-flop FF. Junction 35 of the driver sources of the transistor pair (junctions of the sources of the transistors 23 and 25) of each memory cell is commonly connected.

The pair of bit lines BL and $\overline{BL}$ are arranged for each column. The lines BL and $\overline{BL}$ are commonly connected to the memory cells 17 of the corresponding column. In FIG. 1, for example, for the column number m, and first to mth bit line pairs are arranged.

A bit line load circuit 37 is arranged for each column. One end of each of the bit lines BL and $\overline{BL}$ is connected to the power source voltage VDD terminal through the circuit 37. The circuits 37 are normally of an ON type. Each circuit 37 comprises first and second n-channel MOS transistors 39 and 41. The transistor 39 is connected to one end of the current path of the line BL, and the other end of the transistor 39 is connected to the power source voltage VDD terminal. The transistor 41 is connected to one end of a current path of the line $\overline{BL}$, and the other end of the transistor 41 is connected to the power source voltage VDD terminal. The gates of the transistors 39 and 41 are connected to the power source voltage VDD terminal.

Column selection switch circuits 43 are arranged for each column. The other end of each of the lines BL and $\overline{BL}$ is connected to the circuit 43. The circuit 43 comprises first and second n-channel MOS transistors 45 and 47. One end of the current path of the transistor 45 is connected to the line BL. One end of the current path of the transistor 47 is connected to the line $\overline{BL}$. The gates of the transistors 45 and 47 are connected to column decoder output terminals (to be described later). The other end of each of the current paths of the transistors 45 and 47 is connected as a terminal of the circuit 43 to a sense amplifier and a write circuit (to be described later).

Selection signal input terminals (gates of the transistors 45 and 47) of each circuit 43 are connected to a column decoder 49. The decoder 49 receives a column address signal and decodes the input signal. The decoder 49 supplies the active level column selection signal to the circuits 43 of the selected columns, and the nonactive level column selection signal to the circuits 43 of the nonselected columns in accordance with the decoded results. Although omitted in FIG. 1, the circuits 43 of columns having the same address are connected to the same output terminals of the decoder 49. The same column selection signal is supplied to the circuits 43 of the same column. For example, when 8 bits constitute one word, the same column selection signal is supplied to eight columns which are, consequently, simultaneously addressed.

Each circuit 43 is connected to input terminals of a corresponding sense amplifier 51. The output terminals of the sense amplifier 51 are connected to an output buffer 53.

Each circuit 43 is also connected to the output terminals of a corresponding write circuit 55. The input terminals of each write circuit 55 are connected to the output terminals of a corresponding input buffer 57.

A voltage converter 59 is arranged for each column. The converter 59 is connected to a corresponding output terminal of the decoder 49 to receive the column selection signal. The output terminal of each converter 59 is commonly connected to the source junctions 35 of the transistor pairs of the memory cells 17 of the same column. Each converter 59 controls the voltages at the source junctions 35 of the transistor pairs of the memory cells 17 of the same column in response to the column selection signal. The converters 59 of columns having the same address are connected to the same output terminal of the decoder 49, as in the circuits 43, and receive a single column selection signal.

The operation of the memory device shown in FIG. 1 will be described hereinafter. First, the read operation will be described.

In this operation, a voltage level of one of the word lines WL1 to WLn is set by the driver 15 at H level in response to the row address signal.

The column selection signal representing the column to be accessed by the column address signal is set by the decoder 49 at H level. A voltage of H level is applied to the gates of the transistors 45 and 47 of the circuits 43 of the selected columns (8 columns, since 8 bits constitute one word). The circuits 43 of the selected columns are turned on. The storage data is read out from the memory cells 17 accessed by the row and column address data and is supplied to the sense amplifiers 51 through the circuits 43. Data amplified by the sense amplifiers 51 is generated through the output buffers 53. On the other hand, the decoder 49 supplies the column selection signal of L level to the circuits 43 of the nonselected columns. Therefore, the circuits 43 of the nonselected columns are turned off, and data is not supplied to the sense amplifiers 51.

The column selection signals from the decoder 49 are also supplied to the converters 59. Each converter 59 generates a ground level voltage when the column selection signal is set at H level. However, when the column selection signal is set at L level, the converter 59 generates a voltage (i.e., an intermediate voltage between the power source voltage VDD and the ground level) slightly higher than the ground level. In other words, the converters 59 of the selected columns generate the ground level voltage, and the converters 59 of the nonselected columns generate the intermediate voltage. The converters 59 supply the ground level voltage to the source junctions 35 of the drive transistor pairs of the memory cells 17 of the selected columns, and the intermediate voltage to the source junctions 35 of the memory cells 17 of the nonselected columns.

In the write access mode, data entered from the input buffers 57 is written by the write circuits 55 in the memory cells 17 addressed by the row and column address signals. In this case, the converters 59 receive the column selection signals and apply the ground level voltage to the source junctions 35 of the drive transistor pairs of the memory cells 17 of the selected columns, and the intermediate voltage to the source junctions 35 of the drive transistor pairs of the memory cells 17 of the nonselected columns.

The arrangement of the converter 59 will be described in detail with reference to FIG. 2.

Each converter 59 comprises an n-channel MOS transistor 61 and a p-channel MOS transistor 63. The output terminal of the decoder 49 is connected to the gates of the transistors 61 and 63. One end of each of the current paths of the transistors 61 and 63 is at the ground level voltage. The other end of the current path of the transistor 61 is connected to that of the transistor 63. A junction 65 of these current paths is connected to the source junctions 35 of the drive transistor pairs of the memory cells 17 of the same column.

In the arrangement of FIG. 2, when the column selection signal is set at H level, the transistor 61 is turned on, and the transistor 63 is turned off. A voltage at the junction 65 is set at the ground level. However, when the column selection signal is set at L level, the transistor 61 is turned off, and the transistor 63 is turned on. The junction 65 is set at a voltage higher than the ground level by the absolute value of a threshold voltage (e.g., $-1.1V$) given by a reverse biasing effect of the transistor 63.

The arrangement of the converter 59 is not limited to that shown in FIG. 2. A known circuit for converting an output signal in response to an input signal can be applied.

In the static RAM having the arrangement of FIG. 1, the bit line current of each selected column is substantially the same as that of each of the selected and nonselected columns of the conventional memory device. However, the bit line current of each nonselected column is smaller than that of each selected column.

As shown in FIG. 3A, in each selected column, a bit line current I0 flows from the power source voltage VDD terminal to the ground through the transistor 39 (or 41), the transistor 19 (or 21) of the memory cell 17 and the transistor 23 (or 25). When an equivalent resistance of the transistors 39, 19 and 23 is given by R0, power consumption P0 of each selected column can be given:

$$P0 = VDD^2/R0$$

As shown in FIG. 4A, in each nonselected column, a bit line current I1 flows from the power source voltage VDD terminal to the ground through the transistor 39 (or 41), the transistor 19 (or 21), the transistor 23 (or 25) and the converter 59. When an equivalent resistance of the transistors 39, 19 and 23, and an equivalent resistance of the converter are given as R1 and R2, respectively, power consumption P1 is derived as follows:

$$P1 = VDD^2/(R1+R2)$$

The equivalent resistance R1 is given when the intermediate voltage is applied to the source junction 35 of the memory cell 17, and is higher than the equivalent resistance R0 (R1>R0) obtained when the ground voltage is applied to the junction 35. The power consumption P1 is smaller than the power consumption P0 and is given as follows:

$$P1 = P0 \times R0/(R1+R2)$$

With the memory device having the arrangement described above, the power consumption can be decreased.

The flip-flop circuit FF of each memory cell 17 has a wide power source voltage margin. For this reason, even if a voltage applied to the source junction 35 varies greatly, the storage data will not be broken.

A memory device according to a second embodiment of the present invention will be described hereinafter.

In a typical conventional memory device, source wiring of the drive transistor of a given memory cell is commonly used with that of an adjacent memory cell. Alternatively, in a conventional memory device, source wiring is provided for every several columns. In the memory cell with this layout, the voltages at the source junctions of the drive transistors of the memory cells cannot be controlled in units of columns.

In the second embodiment, voltages at the source junctions of the drive transistors of the memory cells are controlled in units of sections (each section consists of several columns).

The arrangement of the memory device according to the second embodiment will be described with reference to FIG. 5. The same reference numerals in FIG. 5 denote the same parts as in FIG. 1, and a detailed description thereof will be omitted.

Figure 5:
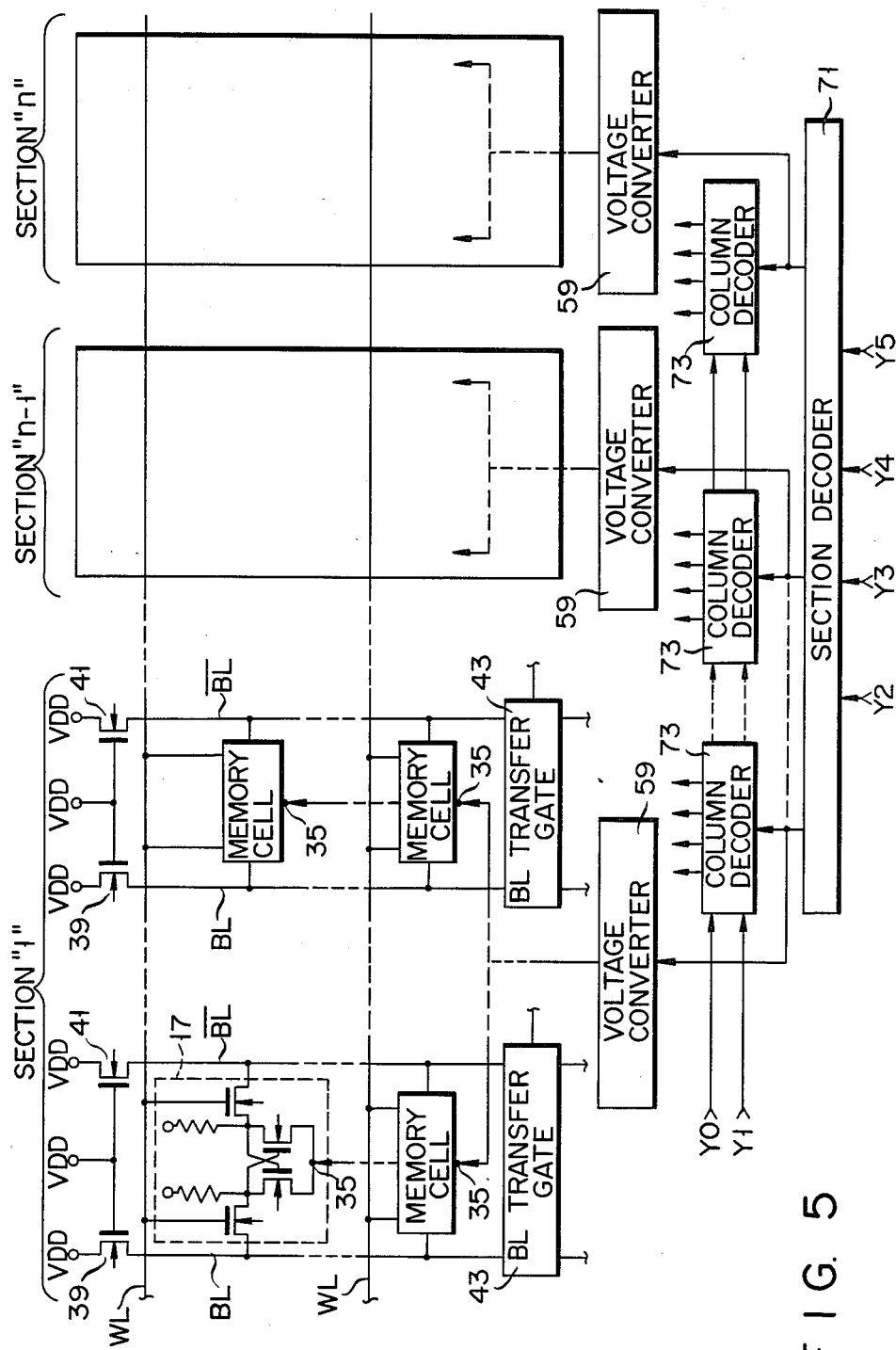
FIG. 5 is a block diagram of a memory device according to a second embodiment of the present invention.

The main feature of the memory device of FIG. 5 is that a plurality of columns constitute a section, and the entire memory area is divided into N sections. Source junctions 35 of the drive transistor pairs of memory cells 17 belonging to each section are mutually connected. A voltage converter 59 is arranged for each section. The output terminals of the converters 59 are connected to the source junctions 35 of the drive transistor pairs of the memory cells 17 of the corresponding section. The memory device of the second embodiment also has a section decoder 71. A column decoder 73 is arranged in units of sections.

The upper bits of the column address signal are supplied to the decoder 71. An output signal from the decoder 71 is supplied to the converters 59 and the decoders 73. Each decoder 73 also receives the lower bits of the column address signal.

An output signal from the decoder 71 is supplied to the corresponding converter 59. An output signal from each decoder 73 is supplied to the corresponding circuit 43.

The operation will now be described in more detail. Assume that a memory device has 512 columns which are divided into 16 sections. Also assume that eight bits constitute one word. In this case, 32 columns constitute one section. A converter 59 and a decoder 73 are provided for each section, such that 16 converters 59 and 16 decoders 73 are arranged in the memory device.

A 4-bit signal consisting of the second to fifth bits of the column address signal is supplied to the decoder 71. The decoder 71 decodes the 4-bit input signal and selects one of the 16 sections. An enable signal is supplied to the decoder 73 of the selected section. Each column decoder 73 receives the 0th and 1st bits of the column address signal and decodes these bits. The selected decoder 73 receives the enable signal and supplies the enable signal to the circuits 43 of 8 columns having the same address in the corresponding section (32 columns). Therefore, data write/read access can be performed for the selected memory cells 17.

The converters 59 receive the output signal from the decoder 71. Each converter 59 generates the ground level voltage when an input voltage from the decoder 71 is set at H level. However, when the input voltage from the decoder 71 is set at L level, the converter 59 generates the intermediate level voltage. Therefore, the ground level voltage is applied to the source junctions 35 of the drive transistor pairs of the memory cells 17 of the selected section, and the intermediate voltage is applied to the source junctions 35 of the drive transistor pairs of the memory cells 17 of the nonselected sections.

With the above arrangement, the power consumption is increased as compared with the device of the first embodiment. For, while in the first embodiment the ground level voltage is applied to the source junctions 35 of the drive transistor pairs of the memory cells 17 of 8 columns, according to the second embodiment, the ground voltage is applied to the memory cells of 32 columns. Nonetheless, though greater than that of the first embodiment, the power consumption of the second embodiment can be greatly decreased as compared with that of the conventional memory device.

In the above embodiments, the converter 59 applies the ground level signal to the memory cells 17 of the selected columns. However, the present invention is not limited to this. Voltages applied to the memory cells can be arbitrarily selected.

In the above embodiments, the voltages applied to the source junctions 35 of the drive transistor pairs of the memory cells are switched for the selected or nonselected columns (or the selected or nonselected sections). However, the present invention is not limited to the embodiments described above. The equivalent resistance of the bit line load circuit may vary. For example, in the bit line load circuit 37 shown in FIG. 6, the gate voltages VG of the transistors 39 and 41 can be set at VDD in the selected column. However, in the nonselected column, the gate voltages VG are set at VDD−ΔV, which is slightly lower than the voltage VDD. In this case, the bit line current of the nonselected columns can be decreased.

The transistors 39 and 41 of FIG. 6 may be replaced with p-channel MOS transistors. In the selected column, the gate voltage is set at the ground voltage. However, in the nonselected column, the gate voltage is set at a voltage ΔV slightly higher than the ground voltage.

The voltage applied to the bit line load circuit 37 may vary. For example, referring to FIG. 6, the power source voltage VDD may be applied to one end of each of the current paths of the transistors 39 and 41 in the selected column and a voltage (VDD−ΔV), slightly lower than the power source voltage VDD, may be applied to one end of each of the current paths of the transistors 39 and 41 in the nonselected column, while the gate voltage VG is kept constant.

A circuit arrangement for switching the power source voltages may comprise a conventional voltage switching circuit.

The voltage at the source junction 35 and the equivalent resistance of the bit line load circuit 37 can be simultaneously controlled in accordance with the selected or nonselected column. It is essential to increase voltages between source junctions 35 and junctions between the bit lines BL and $\overline{BL}$ and the memory cell 17 in the selected column, and to decrease these voltages in the nonselected column so that a current flowing through the bit line in the selected column can be set at a lower level than that in the nonselected column. In other words, it is essential to decrease the equivalent resistance between the power source voltage VDD terminal and the ground in the selected columns, but to increase it in the nonselected column.

An inverter which is used as an element of the flip-flop FF of the memory cell 17 is not limited to an enhancement transistor/resistor type inverter. For example, the inverter may be of an E/D (enhancement/depletion transistor load) type or a CMOS transistor type using a p-channel MOS transistor load. The bit line load circuit need not be of an n-channel, normally ON type, but, rather, can also be of a p-channel normally ON type.

The present invention is not limited to a memory IC, but can be extended to an on-chip memory such as a main memory of a one-chip microcomputer.

What is claimed is:

1. A memory device comprising:
   static memory cells arranged in a matrix form including a plurality of rows and columns, each memory cell being provided with first and second load circuits, each of said first and second load circuits having one end and another end, said first and second load ciruits receiving a first voltage at said one end, a first MOS transistor having a current path connected at one end to said another end of said first load circuit and having a gate connected to said another end of said second load circuit, and a second MOS transistor having a current path connected to one end to said another end of said second load circuit and having a gate connected to said another end of said first load circuit, another end of the current path of said second MOS transistor being connected to another end of the current path of said first MOS transistor;
   a plurality of pairs of bit lines each of said pairs being commonly connected to the memory cells corresponding to a particular column;
   a plurality of word lines each of which is connected to said memory cells of a corresponding one of said rows;
   column decoder means for receiving and decoding a column address signal and generating a column selection signal for selecting at least one of said columns;
   row decoder means connected to said word lines for receiving and decoding a row address signal and for setting a word line voltage corresponding to the row address signal at an active level; and
   a plurality of voltage control circuits each including a P channel MOS transistor and a N channel MOS transistor, one end of each of said P and N channel MOS transistors being connected to said another end of said first and second MOS transistors, respectively, in the memory cells of at least one of the columns, another end of each of said P and N channel MOS transistors receiving a second voltage lower than said first voltage, and the gates of said P and N channel MOS transistors receiving the column selection signal.

2. A device according to claim 1, wherein each of said voltage control circuits applies the second voltage to said another end of the current path of both of said first and second transistors of said memory cells of at least one selected column, and an intermediate voltage, higher than the second voltage and lower than the first voltage, to said another end of the current path of both of the first and second transistors of said memory cells of nonselected columns in response to the column selection signal.

3. A device according to claim 1, wherein said columns are divided into sections each having a plurality of columns, and wherein one of said voltage control circuits is provided at each of the sections and is connected to said memory cells of each section.

4. A device according to claim 1, wherein one of said voltage control circuits is provided at each column and is connected to the memory cells of a respective column.

5. A device according to claim 1, wherein said N channel MOS transistor and said P channel MOS transistor of each voltage control circuit connected to the memory cells of said selected column are respectively turned on and turned off in response to said column selection signal, and said N channel MOS transistor and said P channel MOS transistor of each voltage control circuit connected to the memory cells of said nonselected columns are respectively turned off and turned on in response to said column selection signal.

6. A static memory circuit, operatively connected to receive column selection signals, comprising:
   a first power supply;
   a second power supply the potential of which is lower than that of said first power supply;
   a plurality of word lines;
   a plurality of pairs of bit lines;
   a plurality of pairs of column selection gate transistors, each pair operatively connected to one of said plurality of pairs of bit lines and controlled by said column selection signal;
   a plurality of memory cells each of which includes
      a pair of first loads operatively connected to said first power supply,
      first and second MOS transistors, each having a gate operatively connected both to a respective one of said first loads and to a drain of the other transistor of said first and second transistors, and each having a source operatively connected to a source of the other transistor of said first and second transistors, and
      third and fourth transistors, each having a drain operatively connected to one of the respective bit lines of a respective one of said pairs of bit lines, each having a source operatively connected to a respective one of the drains of said first and second transistors, and each having a gate operatively connected to a respective one of said word lines; and
   voltage control circuits, each of which comprises a P-channel MOS transistor and a N-channel MOS transistor, one end of a current path of said N-channel MOS transistor and one end of a current path of said P-channel MOS transistor are operatively connected to both said source of said first and seocnd MOS transistors of said memory cells of a respective one of at least one of the columns, another end of the current path of said N-channel MOS transistor and another end of the current path of said P-channel MOS transistor are connected to said second power supply, the gates of said first and second MOS transistors receiving the column select signal, said voltage control circuits setting the potential of the sources of said first and second MOS transistors of said memory cells of at least one selected column lower than the potential of the sources of said first and second MOS transistors of said memory cells of nonselected columns.

7. A device according to claim 6, wherein each of said voltage control circuits applies the second voltage to said another end of the current path of said first and second MOS transistors of said memory cells of at least one selected column, and applies an intermediate voltage, higher than the second voltage and lower than the first voltage, to said another end of the current path of the first and second transistors of said memory cells of nonselected columns in response to the column selection signal.

8. A device according to claim 6, wherein said columns are divided into sections each having a plurality of columns, and wherein one of said voltage control circuits is provided at each of the sections and is connected to said memory cells of each section.

9. A device according to claim 6, wherein one of said voltage control circuits is provided at each column and is connected to the memory cells of a corresponding column.

10. A device according to claim 6, wherein said N-channel MOS transistor and said P-channel MOS transistor of each voltage control circuit connected to the memory cells of said selected columns are respectively turned on and turned off in response to said column selection signal, and said N-channel MOS transistor and said P-channel MOS transistor of each voltage control circuit connected to the memory cells of said nonselected columns are respectively turned off and turned on in response to said column selection signal.

* * * * *